US011855308B2

(12) United States Patent
Shi et al.

(10) Patent No.: US 11,855,308 B2
(45) Date of Patent: Dec. 26, 2023

(54) CARBON COATED HYDROGEN FUEL CELL BIPOLAR PLATES

(71) Applicant: Nanofilm Technologies International Limited, Singapore (SG)

(72) Inventors: Xu Shi, Singapore (SG); Zhi Tang, Singapore (SG)

(73) Assignee: Nanofilm Technologies International Limited, Singapore (SG)

(*) Notice: Subject to any disclaimer, the term of this patent is extended or adjusted under 35 U.S.C. 154(b) by 0 days.

(21) Appl. No.: 17/904,232

(22) PCT Filed: Jul. 14, 2021

(86) PCT No.: PCT/EP2021/069662
§ 371 (c)(1),
(2) Date: Aug. 15, 2022

(87) PCT Pub. No.: WO2022/013317
PCT Pub. Date: Jan. 20, 2022

(65) Prior Publication Data
US 2023/0137731 A1    May 4, 2023

(30) Foreign Application Priority Data

Jul. 14, 2020 (EP) .................................. 20185790
Jun. 11, 2021 (EP) .................................. 21179135

(51) Int. Cl.
H01M 8/0213    (2016.01)
C23C 14/02     (2006.01)
C23C 14/06     (2006.01)
H01M 8/0206    (2016.01)
H01M 8/021     (2016.01)
H01M 8/0228    (2016.01)

(52) U.S. Cl.
CPC ......... *H01M 8/0213* (2013.01); *C23C 14/025* (2013.01); *C23C 14/0605* (2013.01); *C23C 14/0635* (2013.01); *C23C 14/0641* (2013.01); *H01M 8/021* (2013.01); *H01M 8/0206* (2013.01); *H01M 8/0228* (2013.01)

(58) Field of Classification Search
CPC .. H01M 8/0213; H01M 8/0206; H01M 8/021; H01M 8/0228; C23C 14/025; C23C 14/0605; C23C 14/0635; C23C 14/0641
See application file for complete search history.

(56) References Cited

U.S. PATENT DOCUMENTS 8,993,197 B2     3/2015  Iseki et al.
2007/0099012 A1* 5/2007  Brady .................... C22C 38/24
                                                   428/457
2013/0209917 A1* 8/2013  Himeno .................. C23C 14/35
                                                   429/480

FOREIGN PATENT DOCUMENTS

| CN | 109560290 | 4/2019 |
| CN | 106374116 | 9/2019 |
| CN | 110783594 | 2/2020 |
| EP | 3650582 | 5/2020 |
| EP | 3670696 | 6/2020 |
| JP | 2005-093172 A | 4/2005 |
| JP | 2011-134653 A | 7/2011 |
| JP | 2021-093298 A | 6/2021 |
| JP | 2022-059550 A | 4/2022 |
| WO | WO 01/28019 | 4/2001 |
| WO | WO 2013/124690 | 8/2013 |

OTHER PUBLICATIONS

Li Zhuguo et al., "Investigation of single-layer and multilayer coatings for aluminum bipolar plate in polymer electrolyte membrane fuel cell," *International Journal of Hydrogen Energy 39*:8421-8420, Elsevier Science Publishers B.V. (2014).
Zhang Weixin et al., "Strategy of alternating bias voltage on corrosion resistance and interfacial conductivity enhancement of TiCx/a-C coatings on metallic bipolar plates in PEMFCs," *Energy* 162:933-943, Elsevier (2018).
Liu, L. et al., "Diamond-like carbon thin films with high density and low internal stress deposited by coupling DC/RF magnetron sputtering," *Diamond & Related Materials 70*:151-158, Elsevier B.V. (2016).
Schwan, J. et al., "Tetrahedral amorphous carbon films prepared by magnetron sputtering and de ion plating," *Journal of Applied Science* 79:1416, American Institute of Physics (1996).
Neuville S, "New application perspective for tetrahedral amorphous carbon coatings", *QScience Connect 2014*:8, Bloomsbury Qatar Foundation Journals (2014).

* cited by examiner

Primary Examiner — Sarah A. Slifka
(74) Attorney, Agent, or Firm — Sterne, Kessler, Goldstein & Fox P.L.L.C.

(57) ABSTRACT

A bipolar plate for a PEM hydrogen fuel cell is coated with a carbon-containing coating, the carbon-containing coating comprising in order: a) a titanium seed layer; b) a titanium nitride interfacial layer; and c) a a-C top layer, and wherein the bipolar plate is formed from stainless steel. Methods for making such coated plates are described. The a-C has a density of greater than 2.0 g/cm3, a molar hydrogen content of 5% or less, an sp2 carbon content of 40% to 80% and an sp3 carbon content of 20% to 60%. The coated plates possess good electrical conductivity and are resistant to corrosion.

18 Claims, No Drawings

CARBON COATED HYDROGEN FUEL CELL BIPOLAR PLATES

INTRODUCTION

The present invention relates to bipolar plates for use in hydrogen fuel cells (in particular PEM fuel cells) coated with a carbon-containing coating. The carbon-coated bipolar plates possess good corrosion resistance and offer a more economical alternative to known coated bipolar plates.

BACKGROUND TO THE INVENTION

A large variety of deposition techniques are used to coat substrates. Vapor deposition technology is typically used to form thin film deposition layers in various types of applications, including microelectronic applications and heavy-duty applications.

One example of a known physical vapor deposition technique is cathodic vapor arc deposition methods. In this method, an electric arc is used to vaporize material from a cathode target. Consequently, the resulting vaporized material condenses on a substrate to form a thin film of coating. Cathode arc deposition of tetrahedral amorphous carbon, metallic, dielectric and other such coatings is known in the art and offers the potential for deposition of thin films of high quality.

Amorphous carbon is a free, reactive form of carbon which does not have a crystalline form. Various forms of amorphous carbon films exist and these are usually categorised by the hydrogen content of the film and the $sp^2:sp^3$ ratio of the carbon atoms in the film.

In an example of the literature in this field, amorphous carbon films are categorised into 7 categories (see table below taken from "Name Index of Carbon Coatings" from Fraunhofer Institut Schicht- and Oberflächentechnik):

| Amorphous Carbon Films | | | | | | |
|---|---|---|---|---|---|---|
| Hydrogen-Free | | | Hydrogenated | | | |
| | Modified With metals | | | | Modified with | |
| Unmodified | | $sp^2$ | | | Metals | Non-metals |
| | $sp^3$ | Metal- | Unmodified | | $sp^2$ | $sp^2$ |
| $sp^2$ Hydrogen-free amorphous carbon | Tetrahedral, hydrogen-free amorphous carbon | containing, hydrogen-free amorphous carbon | $sp^2$ or $sp^3$ Hydrogenated amorphous carbon | $sp^3$ Tetrahedral, hydrogenated amorphous carbon | Metal-containing, hydrogenated amorphous carbon | Non-metal containing hydrogenated amorphous carbon |
| a-C | ta-C | a-C:Me | a-C:H | ta-C:H | a-C:H:Me | a-C:H:X |

Amorphous and tetrahedral amorphous carbon (a-C and ta-C) are characterised in that they contain little or no hydrogen (less than 10% mol, generally less than 5% mol, typically less than 2% mol).

Tetrahedral hydrogen-free amorphous carbon (ta-C) is further characterised in that it contains a high content of $sp^3$ hybridised carbon atoms (typically greater than 80% of the carbon atoms being in the $sp^3$ state).

Whilst the term "diamond-like carbon" (DLC) is sometimes used to refer to all forms of amorphous carbon materials, the term as used herein refers to amorphous carbon materials other than a-C/to-C. Common methods of DLC manufacture use hydrocarbons (such as acetylene), hence introducing hydrogen into the films (in contrast to a-C/ta-C films in which the raw material is typically hydrogen free high purity graphite).

In other words, DLC typically has an $sp^2$ carbon content of greater than 50% and/or a hydrogen content of 20% mol and above. The DLC may be undoped or doped with metals or non-metals (see table above).

Tetrahedral amorphous carbon coatings have high hardness and low friction coefficient and are excellent wear-resistant coatings. At the same time, the ta-C and also a-C can maintain its stability over long time periods in harsh environments (such as acidic or alkaline conditions) and therefore has broad prospects in the development of anti-corrosion applications.

An increasing awareness of the effects of climate change has led to an increase in research on alternative "fossil free" energy sources, such as hydrogen. Hydrogen fuel cells have been developed that produce electrical power through an electrochemical oxidation of hydrogen to form water.

A widely used hydrogen fuel cell is the proton exchange membrane (PEM) fuel cell which comprises a semipermeable membrane which permits protons to pass through the membrane while acting as a barrier to electrons and reactants (e.g. hydrogen and oxygen gas). PEM fuel cells exhibits a number of advantages including having a high energy conversion rate, being environmentally friendly and having a low operating temperature.

As each cell in a PEM fuel cell produces relatively low voltages, multiple PEM cells can be connected in series to increase the output voltage. Adjacent PEM cells are connected by bipolar plates which conducting electricity from one PEM cell to an adjacent PEM cell. The bipolar plates typically also contain channels on their surface along which reactants or coolants can be fed. As a core component of the hydrogen fuel cell, the bipolar plate has many important functions, including collecting conducting current, supporting membrane electrodes, uniformly transporting and isolating reaction gases and circulating coolant for rapid cooling.

While bipolar plates tend to be formed from metals, due to their reactivity towards acids, metallic bipolar plates may be coated with corrosion resistant coatings. A commonly used coating for metallic bipolar plates is gold. However, the gold coating processes significantly increases the cost of the bipolar plate.

XP028655999 discloses aluminium bipolar plates with coatings of TiN, CrN, C, C/TiN, C/CrN and an a-C top layer.

WO 2013/124690 discloses plates made of steel, aluminium or titanium, a TiN, CrN, ZrN, TiC or TiCN layer, and a non-hydrogenated amorphous carbon layer.

XP085490166 discloses a steel bipolar plate coated with a Ti seed layer, TiCx intermediate layer and a carbon layer.

WO 01/28019 discloses an aluminium bipolar plate, coated with a first layer including Ti, a second layer including TiAlN and a hydrophobic graphite outer layer.

EP 3 670 696 discloses a steel substrate, coated with a seed layer, a barrier layer comprising DLC and deposited by CVD, and a ta-C layer deposited by CVA. This document does not disclose the use of this coated substrate as a bipolar plate.

CN 106 374 116 discloses a stainless steel bipolar plate with a high entropy alloy primer layer, a high entropy alloy—carbon mixed transition layer and an outer amorphous carbon layer.

EP 3650 582 discloses a multi-layer coating comprising in order, an SiC seed layer, a thermally insulating layer (e.g. AlN, Si Si3N4, Al2O3), an interfacial layer and one or more layers of to-C. This document does not disclose the use of this coating on a bipolar plate.

CN 109 560 290 discloses a bipolar plate (e.g. of steel) with a conducting coating (metal oxide e.g. ITO), an anti-corrosion coating (e.g. Cr or Ti) and an a-C top coat.

CN 110 783 594 discloses a stainless steel bipolar plate coated with an Ni layer, a graphene layer and an amorphous carbon outer layer.

There therefore exists the need for alternative bipolar plates which exhibit good corrosion resistant properties and preferably are more economical than currently available bipolar plates.

SUMMARY OF INVENTION

The present invention provides electrodes, especially bipolar plates, for hydrogen fuel cells (in particular PEM fuel cells) coated with amorphous carbon (a-C). The electrodes, e.g. a-C coated bipolar plates, have been shown to exhibit low ion leaching and consequently are relatively resistant to corrosion.

Accordingly, the invention provides an electrode for a fuel, being in preferred embodiments a bipolar plate for a PEM hydrogen fuel cell; the electrode is coated with a carbon-containing coating, wherein the carbon-containing coating comprises a-C. Preferably, the coating comprises a layer which consists of a-C and typically this layer is the uppermost layer of the coating (i.e. the layer of the coating exposed to the atmosphere).

The coating may further comprise non-a-C-containing layers, which increase the corrosion resistance of the coating and/or improve adhesion of the a-C-containing layer to the underlying substrate.

Accordingly, the invention also provides a bipolar plate for a PEM hydrogen fuel cell coated with a carbon-containing coating, the carbon-containing coating comprising in order:
a) a seed layer comprising a metal or metal alloy;
b) an interfacial layer comprising a carbide or nitride of the metal or alloy in the seed layer; and
c) a top layer comprising a-C.

The invention also provides a method of coating a bipolar plate for a PEM hydrogen fuel cell with a carbon-containing coating, the method comprising:

a) applying onto the plate (e.g. via a HIPIMS, DC pulse or metallic FCVA deposition process) a seed layer comprising a metal (e.g. titanium) or an alloy;
b) applying onto the seed layer (e.g. via a sputtering process) an interfacial layer comprising a nitride or carbide of the metal or alloy (e.g. titanium nitride); and
c) applying onto the interfacial layer (e.g. via an FCVA process) a layer comprising a-C.

Advantages of the bipolar plates of the invention may include one or more or all of improved corrosion resistance, reduced leaching of electrode material (e.g. reduced ion leaching) and lower costs compared with conventional gold coated bipolar plates.

It is optional in embodiments of the electrodes, plates and methods of the invention for the a-C to comprise the tetrahedral form of amorphous carbon, hence to-C.

Details of the Invention

The invention advantageously provides electrodes having coatings that include an amorphous carbon layer and other layers deposited as described herein. The invention provides electrodes with coatings that are suitably hard and have high wear resistance in use, and now good corrosion resistance as a consequence of the overall coating, including the one or more intermediate CVD-deposited layer(s). Testing shown below in specific examples demonstrate improved properties of electrodes/plates as per the invention.

The electrodes may be bipolar plates; accordingly, the invention provides a bipolar plate for a PEM hydrogen fuel cell coated with a carbon-containing coating, wherein the carbon-containing coating comprises or consists of a-C.

Preferably, the coating comprises a layer which consists of a-C and typically this layer is the uppermost layer of the coating (i.e. the layer of the coating exposed to the atmosphere). The a-C may be or comprise to-C.

The coatings may also comprise one or more additional layers in between the substrate and the a-C containing layer which improve adhesion of the a-C layer to the substrate and/or impart further corrosion resistant properties to the coating.

The coating on the electrode, e.g. bipolar plate, typically comprises a seed layer; this is coated onto the substrate, which is typically metallic.

The coating typically also comprises an interfacial layer between the seed layer and the a-C—containing layer (also referred to as the top or uppermost layer).

The substrate may also be formed of other materials from which e.g. bipolar plates are typically made, including carbon materials (such as graphite) and composite materials (such as a graphite or composite plate). When the substrate is metallic, the substrate may be formed of a single metal or be formed from an alloy (e.g. an alloy of iron, titanium or aluminium). The metallic substrate is preferably a steel substrate, preferably stainless steel, such as a SUS304 or 316L stainless steel substrate, which is commonly used in the manufacture of bipolar plates for PEM cells. SUS301 and SUS303 stainless steel may also be suitable for use as the substrate.

The size of the metallic substrate will of course depend on the size of the PEM cell and the intended application(s) of the PEM cell. However, the metallic substrate (i.e. not including the coating) will typically have a thickness of 0.5 mm or less, for example 0.3 mm or less, preferably 0.2 mm or less (such as approximately 0.05 mm or 0.1 mm); thinner substrates are being used in e.g. air cooled versions of plates.

The metallic substrate typically comprises channels on its surface, which may be formed by stamping or etching. These channels allow for the transfer of coolants or reagents between adjacent bipolar plates.

In preferred embodiments, a seed layer is deposited on the metallic substrate. The seed layer serves to promote adhesion of the metallic substrate and the interfacial layer and may also exhibit some corrosion resistant properties. The seed layer comprises (and preferably consists of) a metal or an alloy. Preferably, the metal/alloy is selected from chromium, titanium, alloys of chromium and alloys of titanium. Even more preferably, the metal in the seed layer is or comprises titanium.

The seed layer typically has a thickness of 0.5 μm or less, suitably 0.4 μm or less, preferably 0.3 μm or less. In addition, the seed layer is usually 0.05 μm or thicker, for example 0.1 μm or thicker. In a specific example, described below, the seed layer was approximately 0.3 μm.

As mentioned above, the seed layer may impart some corrosion resistant properties to the overall coating and therefore deposition of the seed layer should ensure that as much of the substrate is covered as possible. The seed layer is preferably deposited to be high density. The seed layer may therefore be deposited using a variety of plasma vapour deposition or chemical vapour deposition techniques. Preferably, the seed layer is deposited by FCVA or multi-arc deposition or sputtering, e.g. especially using magnetron sputtering (including high-power impulse magnetron sputtering as this promotes dense coatings).

The seed layer typically contains very few impurities (i.e. the seed layer is typically very pure); for example the impurity content in the seed layer may be 10% or less, typically 5% or less, preferably 2% or less (for example 1% or less). An impurity as mentioned herein refers to any substance other than that which is intended to make up the seed layer. For example, if the seed layer consists of Ti, then any element other than Ti present in the seed layer can be considered an impurity.

The interfacial layer when present promotes adhesion of the a-C containing layer to the seed layer. As for the seed layer, the interfacial layer may also increase the corrosion resistance of the coating. In addition, the interfacial layer may have a role in reducing the contact resistance of the electrode/substrate. Preferably, the interfacial layer is of a relatively low density (compared to the seed layer and a-C-containing layer) and exhibits pinholes or vacated columnar pockets within the coating. It may be deposited under conditions that promote low density coatings and promote formation of columnar growth within the coating.

The interfacial layer is generally formed from a carbide or nitride of a metal or alloy and usually a carbide or nitride of the metal/alloy of the seed layer. For example, when the seed layer is a titanium seed layer, the interfacial layer may comprise or consist of titanium carbide, titanium nitride, or a mixture thereof. Likewise, when the seed layer is a chromium seed layer, the interfacial layer may comprise or consist of chromium carbide, chromium nitride or a mixture thereof. Preferably, when the seed layer comprises or consists of titanium, the interfacial layer comprises or consists of titanium nitride.

The interfacial layer typically has a thickness of 0.5 μm or less, preferably 0.3 μm or less. In addition, the interfacial layer is usually 0.05 μm or thicker, for example 0.1 μm or thicker. In an example below, the interfacial layer had a thickness of approximately 0.2 μm.

As mentioned above, the interfacial layer may impart some corrosion resistant properties to the overall coating and therefore deposition of the interfacial layer should ensure that as much of the substrate is covered as possible. The interfacial layer may therefore be deposited using a variety of plasma vapour deposition or chemical vapour deposition techniques. Preferably, the interfacial layer is deposited by sputtering, preferably adjusted to give a reduced density coating.

The interfacial layer typically contains very few impurities (i.e. the interfacial layer is typically very pure); for example the impurity content in the seed layer may be 10% or less, typically 5% or less, preferably 2% or less (for example 1% or less). For example, if the seed layer consists of titanium nitride, then any element other than Ti or N present in the seed layer can be considered an impurity.

Accordingly, the carbon-containing coating may comprise in order:
 a) a seed layer comprising a metal or alloy;
 b) an interfacial layer comprising a carbide or nitride of the metal/alloy in the seed layer; and
 c) a top layer comprising a-C.

The uppermost layer of the coating (i.e. the layer exposed to the atmosphere) is an a-C-containing layer. The layer may comprise greater than 70%, for example greater than 80%, preferably greater than 90% a-C by weight or the layer may substantially consist of a-C. The a-C layer is both electrically conducting and also corrosion resistant.

As discussed above, the term "amorphous carbon" (a-C) as used herein refers to $sp^2$-containing amorphous carbon having a low hydrogen content. For example, the a-C may have a hydrogen content of 10% or less, typically 5% or less, preferably 2% or less (for example 1% or less). The percentage content of hydrogen provided here refers to the molar percentage (rather than the percentage of hydrogen by mass). In preferred embodiments the a-C coating is substantially hydrogen free.

Additionally, it is preferred that the a-C has a low nitrogen content. For example, the a-C may have a nitrogen content of 10% or less, typically 5% or less, preferably 2% or less (for example 1% or less). The percentage content of nitrogen provided here refers to the molar percentage (rather than the percentage of nitrogen by mass).

The a-C may have a $sp^2$ content of 95% or less, generally 90% or less, or 80% or less, preferably 70% or less, most preferably 60% or less; it may have a $sp^2$ content of 20% or more, generally 40% or more, or 50% or more. Typically, the $sp^2$ carbon content falls from 90% to 40%, suitably from 80% to 50%, preferably from 70% to 40%, most preferably from 60% to 50% (for example the a-C may have an average $sp^2$ content of 55%).

Separately, the a-C may have a $sp^3$ content of 5% or more, generally 10% or more, or 20% or more, preferably 30% or more, most preferably 40% or more; it may have a $sp^3$ content of 80% or less, generally 60% or less, or 50% or less. Typically, the $sp^3$ carbon content falls from 10% to 60%, suitably from 20% to 50%, preferably 30% to 60%, most preferably 40% to 50% (for example the a-C layer may have an average $sp^3$ content of 45%).

It is noted that the $sp^2$ and $sp^3$ content may vary throughout the a-C layer. The values provided above are intended as an average of the $sp^2$ and $sp^3$ content in the a-C. Therefore, at any particular position within the a-C layer, the exact $sp^2$ and $sp^3$ content of the a-C may vary from the values provided above. However, across the whole a-C layer, the $sp^2$ and $sp^3$ content may fall within the values provided above.

In embodiments, the a-C layer is a ta-C layer comprising or consisting of to-C. Ta—C is a dense amorphous material described as composed of disordered $sp^3$, interlinked by strong bonds, similar to those that exist in disordered diamond (see Neuville S, "New application perspective for tetrahedral amorphous carbon coatings", QScience Connect 2014:8, http://dx.doi.org/10.5339/connect.2014.8). Due to its structural similarity with diamond, ta-C also is a very hard material with hardness values often greater than 30 GPa.

Ta—C coatings are typically hard and dense. For the present invention hardness at exceptionally high levels may not be necessary. Coatings/layers of a-C provide adequate hardness while retaining suitable conductivity. The coating hardness of a specific embodiment, described below, was approximately 1300 HV and produced good results. An alternative embodiment provided a coating with a hardness of approximately 2000 HV; this coating also produced good results. In general, while a-C/ta-C deposition processes can be adjusted to produce coatings of varying—including of extremely high—hardness, coatings for the present invention do not need to have overly high hardness. Relatively low $sp^3$ content, as described above normally correlates with lower hardness values. Substrates, in this case electrodes or bipolar plates, may suitably have an a-C coating with a hardness of at least 900 HV or at least 1000 HV. Hardness may be in the range 900 HV-3000 HV, suitably in the range 1000 HV-2000 HV, preferably in the range 1500 HV-2000 HV, most preferably in the range 1800 HV-2000 HV. Coatings with a range of measured hardness values within these ranges are believed suitable, and for slightly different end applications, according sometimes to user choice, different hardness may be appropriate.

Hardness is suitably measured using the Vickers hardness test (developed in 1921 by Robert L. Smith and George E. Sandland at Vickers Ltd; see also ASTM E384-17 for standard test), which can be used for all metals and has one of the widest scales among hardness tests. The unit of hardness given by the test is known as the Vickers Pyramid Number (HV) and can be converted into units of pascals (GPa). The hardness number is determined by the surface area of the indentation which is tested by a certain load. As examples, Martensite a hard form of steel has HV of around 1000 and diamond can have a HV of around 10,000 HV (around 98 GPa). Hardness of diamond can vary according to precise crystal structure and orientation but hardness of from about 90 to in excess of 100 GPa is common.

The a-C is optionally doped with other materials (either metals or non-metals).

The a-C coating is also preferably free or substantially free of neutral carbon atoms or particles.

By contrast, the term "diamond-like carbon" (DLC) as used herein refers to amorphous carbon other than a-C/to-C. Accordingly, DLC has a greater hydrogen content than both and a greater $sp^2$ carbon content than to-C. For example, the DLC may have a hydrogen content of 20% or greater, typically 25% or greater, for example 30% or greater. The percentage content of hydrogen provided here again refers to the molar percentage (rather than the percentage of hydrogen by mass). The DLC may have an $sp^2$ carbon content of 50% or greater, typically 60% or greater. Typically, the DLC may have a hydrogen content of greater than 20% and an $sp^2$ carbon content of greater than 50%. The DLC may be undoped or doped with metals and/or non-metals. It is preferred that the a-C coatings used for electrodes of the invention do not consist or comprise DLC and do not fall within the definition of DLC provided herein.

The a-C-containing layer typically has a thickness of 1.0 μm or less, preferably 0.5 μm or less. This layer is generally 0.05 μm or thicker, or more suitably 0.1 μm or thicker, for example 0.2 μm or thicker. In embodiments of the invention the a-C layer thickness is about 0.2 μm or about 0.3 μm.

The a-C-containing layer typically has a density of greater than 2.0 g/cm$^3$, for example greater than 2.5 g/cm$^3$, or preferably greater than 3.0 g/cm$^3$, for example 3.5 g/cm$^3$ or higher. This high density is a result of the carbon-carbon bonds within the coating being very small (even as low as 1-2 angstroms). With this structure, other atoms, not even hydrogen, can pass through and therefore the structure prevents ion leaching and corrosion.

The a-C is typically deposited via a cathodic vacuum arc deposition technique, for example a filtered cathodic vacuum arc (FCVA deposition technique). Apparatus and methods for FCVA coatings are known and can be used as part of the methods of the invention. The FCVA coating apparatus typically comprises a vacuum chamber, an anode, a cathode assembly for generating plasma from a target and a power supply for biasing the substrate to a given voltage. The nature of the FCVA is conventional and not a part of the invention.

The coated bipolar plates described herein possess good corrosion resistant properties, even with a relatively thin coating thickness. For example, the overall coating thickness (including the a-C-containing layer and when present the seed and interfacial layers) is typically less than 2 μm, suitably less than 1.5 μm and is preferably less than 1 μm.

In depositing the layers for electrodes/plates of the invention a number of conventional and commercially available deposition techniques are known. In the above, some embodiments indicate preferred deposition processes. In general, deposition of the layers herein may be achieved using a process appropriate to the skilled person including but not limited to one or more or a combination of known PVD or CVD methods, including sputtering, magnetron sputtering, high-power impulse magnetron sputtering, multi-arc ion plating, arc deposition, cathode vacuum arc deposition, filtered vacuum arc deposition and plasma enhanced chemical vapour deposition.

In some embodiments, the interfacial layer comprising a carbide or nitride of the metal/alloy in the seed layer may be adjacent the top layer comprising a-C. Independently, the seed layer comprising a metal or alloy may be adjacent the interfacial layer comprising a carbide or nitride of the metal/alloy in the seed layer. Independently, the bipolar plate may be adjacent the seed layer comprising a metal or alloy.

In some embodiments, the bipolar plate may be adjacent the seed layer comprising a metal or alloy, and the seed layer comprising a metal or alloy may be adjacent the interfacial layer comprising a carbide or nitride of the metal/alloy in the seed layer, and the interfacial layer comprising a carbide or nitride of the metal/alloy in the seed layer may be adjacent the top layer comprising a-C. For example, after cleaning, the seed layer is deposited directly onto the bipolar plate, and the interfacial layer is deposited directly onto the seed layer, and the a-C layer is deposited directly onto the interfacial layer.

In further embodiments, the carbon-containing coating may consist of, in order:
  a) a seed layer comprising a metal or alloy;
  b) an interfacial layer comprising a carbide or nitride of the metal/alloy in the seed layer; and
  c) a top layer comprising a-C.

Further embodiments of invention are described below:

A bipolar plate of an embodiment of the invention is coated with a carbon-containing coating, the carbon-containing coating comprising in order:

a) a titanium seed layer;
b) a titanium nitride or titanium carbide interfacial layer; and
c) a a-C top layer.

A bipolar plate of an embodiment of the invention is coated with a carbon-containing coating, the carbon-containing coating comprising in order:
a) a chromium seed layer;
b) a chromium nitride or chromium carbide interfacial layer; and
c) a a-C top layer.

A bipolar plate of an embodiment of the invention is coated with a carbon-containing coating, the carbon-containing coating comprising in order:
a) a seed layer of an alloy of titanium or chromium,
b) an interfacial layer of a nitride or carbide of the seed layer alloy,
c) a a-C top layer.

The a-C layer in particular versions of the immediately above three embodiments has a density of greater than 3.0 g/cm$^3$.

A bipolar plate of a further embodiment of the invention is coated with a carbon-containing coating, the carbon-containing coating comprising in order:
a) a titanium seed layer,
b) a titanium nitride interfacial layer,
c) a a-C top layer, having a density of greater than 3.0 g/cm$^3$.

Also provided herein is a method of coating a bipolar plate for a PEM hydrogen fuel cell with a carbon-containing coating, the method comprising:
a) applying onto the plate (e.g. via a HIPIMS, DC pulse or metallic FCVA deposition process) a seed layer comprising a metal (e.g. titanium) or alloy;
b) applying onto the seed layer (e.g. via a sputtering process) an interfacial layer comprising a nitride or carbide of the metal or alloy (e.g. titanium nitride); and
c) applying onto the interfacial layer (e.g. via an FCVA process) a layer comprising a-C.

The substrate, seed layer, interfacial layer and layer comprising a-C may have the features, definitions or limitations described above in relation to the bipolar plates of the invention.

EXAMPLES

The invention is now illustrated in the following examples.

Example 1—Preparation of a Coated Bipolar Plate

A 316L stainless steel bipolar plate was coated as follows.

Step 1) Sample Preparation The bipolar plate was cleaned according to the following process:
a. A weak alkaline solution was used for ultrasonic cleaning to remove oil stains on the surface and in the flow channels.
b. An acidic acid solution was used to remove the oxide layer and any rust on the substrate.
c. The substrate was rinse with pure water under ultrasonic conditions.
d. The substrate was then dried under vacuum conditions for 0.5 hours.

Step 2) Sample Coating

Coating equipment: FCVA coating machine that also includes ion etching capabilities and magnetron sputtering sources.

Process:
a. The cleaned bipolar plate to be coated is placed into the coating chamber and the pressure within the coating chamber is reduced to $5.0 \times 10^{-5}$ Torr (6.6 mPa) and the temperature was increased to 130° C.
b. Ion beam cleaning takes place (using convention ion beam cleaning methodology).
c. The pressure within the chamber is reduced further to $2 \times 10^{-5}$ (2.6 mPa), and the Ti seed layer is deposited under magnetron sputtering conditions, for a time period sufficient to deposit a Ti layer having a thickness of 0.3 μm.
d. After the seed layer has been deposited, deposition of the interfacial layer begins. A TiN interfacial layer is deposited using a sputtering deposition method using a titanium target in the presence of nitrogen case. This deposition step is conducted for a time period sufficient to deposit a TiN layer having a thickness of 0.2 um.
e. After the interfacial layer has been deposited, a layer of 0.2 μm of a-C is deposited using filtered cathode vacuum arc (FCVA) technology. a-C hardness was approximately 1300 HV. Sp$^2$ content was not accurately measured but believed to be in the range 40-70%.
f. After deposition is complete, the vacuum chamber is brought to room temperature and pressure and the coated substrate is removed from the coating chamber.

The finished coated substrate has the following structure:

a-C layer (0.2 μm)
TiN interfacial layer (0.2 μm)
Ti seed layer (0.3 μm)
Substrate - 316L stainless steel bipolar plate Example 2—Ion Leaching Resistance Ion-leaching electrochemical corrosion testing is carried out in a sealed electrochemical corrosion cell with 100 ml of $H_2SO_4$ at pH3 and 0.1 ppm HF as electrolytic solution. The working electrode (WE) used is a coated foil of 316L stainless steel as substrate having no visible defects. The area to which the WE is exposed in electrolyte is approximately 7 cm$^2$. The experiment is performed with saturated Ag/AgCl as the reference electrode (RE), and a 3 cm by 3 cm Pt net as counter electrode (CE). An electrochemical potential of 1.6V vs the standard normal hydrogen electrode (NHE) is applied for 10 hours under 80° C., and the experiment is uncontaminated by outside metal ion content. After the test, the corrosion solution is stored in a PTFE container then tested by a calibrated inductively coupled plasma mass spectrometry (ICP-MS). An Fe ion concentration of less than or equal to 50 ppb is acceptable.

When subjected to the above test conditions, the bipolar plate of Example 1 had an Fe ion concentration of less than 40 ppb.

We compared ion leaching for the bipolar plate of Example 1 with a commercially available gold-plated bipolar plate. The results were:

| Coating | Example 1 | Gold-plated |
|---|---|---|
| Ion-leaching | 37 ppb | 70~80 ppb |

The coating of Example 1 demonstrated improved performance in direct comparison with the industry standard coating.

Example 3— Interfacial Contact Resistance (ICR) and Corrosion Current Density The ICR test is carried out using electrochemical corrosion cell containing 500 ml of $H_2SO_4$ at pH3 and 0.1 ppm HF as electrolytic solution. The working electrode (WE) is a coated 316L foil having no visible defects. The area to which the WE is exposed in electrolyte is approximately 1.9 $cm^2$. The experiment uses saturated Ag/AgCl as reference electrode (RE), and a 3 cm×3 cm Pt net as counter electrode (CE). After three parallel electrochemical tests, the average of ICR measurements under 0.6 MPa should satisfy both of the final contact resistance requirements in the table below.

| Test Potential | Corrosion Time | ICR Requirement |
|---|---|---|
| 1.6 V | 5 hours | ≤5 mΩcm² |
| 0.84 V | 96 hours | ≤5 mΩcm² |

When subjected to the above test conditions, the bipolar plate of Example 1 met these two requirements.

In addition, during testing at a potential of 1.6 Vm the corrosion current density was measured to be less than 1 $\mu A/cm^2$.

Example 4—Conductivity

Conductivity of bipolar plates obtained according to the invention was tested, using the following methods and protocols:

A modified Wang's method for measuring the contact resistance between stainless steel and carbon paper was used.

All the samples (including carbon paper and tested stainless steel sample) were prepared as wafers.

The sample diameter was 60 mm and had the same size as the copper plates in the device. The mating anvils were machined to a flatness of 5-15 µm.

Toray carbon paper (TGPH-060, non-teflonized) was used as gas diffusion layer in these experiments. Stainless steel bipolar plate thickness is determined according to the actual scheme.

The tested stainless-steel sample, coated as per the invention or prior art, was sandwiched by two pieces of carbon paper TGP-H-060, and the carbon paper TGP-H-060 was then sandwiched by the copper plates plated by gold, respectively.

An electrical current of 28.26 A (1 $A/cm^2$) was provided from a PSP-2010 Programmable power supply. During the experiments, the compacting force was controlled by a WDW Electromechanical Universal Testing Machine developed by Changchun Kexin Tester Institute. The compacting force was increased with the step of 5 $N \cdot s^{-1}$ until a final compression pressure of 60 $Ncm^{-2}$ (0.6 MPa) was applied over circular electrode area to simulate stack conditions. By measuring the total voltage drop with an EDM-3150 multi display multimeter, the total resistance can be calculated as:

$$R_{total} = \frac{V_{total} A_o}{I} \quad (1)$$

where $R_{total}$ is the total electrical resistance, $V_{total}$ is the total voltage drop through the setup, I is the current applied to the samples and $A_0$ is the surface area (28.26 $cm^2$).

The total resistance is a sum of four interface resistances and three bulk resistances:

two carbon paper/gold interfaces ($R_c$/Au), two carbon paper/tested stainless steel sample interfaces ($R_{c/ss}$), two bulk resistance of carbon paper ($R_c$) and one stainless steel sample bulk electrical resistance ($R_{ss}$). That is:

$$R_{total} = 2R_{C/Au} + 2R_{C/ss} + 2R_c + R_{ss} \quad (2)$$

The resistance ($R_{c/Au}$) can be expressed as the following equation:

$$R_{c/Au} = \frac{V_{c/Au} A_o}{I} \quad (3)$$

where $V_{C/Au}$ is the voltage drop.

$R_{c/Au}$ may also be expressed as follows:

$$R_{c/Au} = 2R_{c/Au} + 2R_c \quad (4)$$

According to equations (2)-(4), the equation below can be obtained:

$$R = \frac{(V_{total} - V_{c/Au})A_o}{2I} - \frac{R_{ss}}{2} \approx \frac{(V_{total} - V_{c/Au})A_o}{2I} \quad (5)$$

in which, R is the sum of the contact resistance between the carbon paper and the tested stainless-steel sample and part of the bulk resistance of the carbon paper. Due to the high conductivity of tested stainless steel, the bulk electrical resistance ($R_{ss}$) was ignored. Thus, R can be calculated according to equation (5).

Area specific resistance measurements were performed at 12 different locations on the plate and were recorded and averaged.

| | | Results | |
|---|---|---|---|
| Coating | Thickness | Contact resistance | Corrosion current density |
| Gold-plating | 1.1 um | 9 mΩ · cm² | 8.23 × 10⁻⁸ A |
| Example 1 | 0.8 um | 2 mΩ · cm² | 1.27 × 10⁻⁷ A |

These results show the performance of the coating of the invention against the prior art electrode. The Example 1 results are improved, as increased contact resistance increases the electrical efficiency loss of the fuel cell and reduces the performance.

Note that in preparing the comparison experiments, the above gold-plating results are all from the following literature: Qin Ziwei, Mi B S, Chen Zhuo, Wang Hongbin, Research on properties of coating of stainless-steel bipolar plate, Shanghai metals, 2017, 5, vol 39: 5-10.

Thus, the invention provides electrodes, e.g. bipolar plates for fuel cells, and methods of making the same.

Example 5—Preparation of a Coated Bipolar Plate

A further 316L stainless steel bipolar plate was coated largely according to the method described in example 1 above. Substrate bias was modified to increase the hardness, determined to be approximately a hardness of 2000 HV and the average sp2 content of the a-C was approximately 50%— 60%. Layer thicknesses and composition were as follows:

a-C layer (0.3 μm)
TiN interfacial layer (0.2 μm)
Ti seed layer (0.3 μm)
Substrate - 316L stainless steel bipolar plate.

This coated bipolar plate had good properties, in particular it was found to exhibit desirable low ion leaching and to be relatively resistant to corrosion.

The invention claimed is:

1. A bipolar plate for a hydrogen fuel cell, coated with a carbon-containing coating, the carbon-containing coating comprising in order:
    a) a titanium seed layer;
    b) a titanium nitride interfacial layer; and
    c) a a-C top layer,
wherein the coating has a thickness of less than 1.5 μm and the bipolar plate is formed from stainless steel and wherein the a-C has a density of greater than 2.5 g/cm$^3$.

2. A coated bipolar plate according to claim 1, wherein the carbon-containing coating consists of in order:
    a) a titanium seed layer;
    b) a titanium nitride interfacial layer; and
    c) a a-C top layer.

3. A bipolar plate according to claim 1, wherein the layer of a-C has a molar hydrogen content of 5% or less and/or a molar nitrogen content of 5% or less.

4. A bipolar plate according to claim 1, wherein the layer of a-C has an sp$^2$ carbon content of 50% to 80%.

5. A bipolar plate according to claim 1, wherein the layer of a-C has an sp$^3$ carbon content of 30% to 60%.

6. A bipolar plate according to claim 1, wherein the layer of a-C has a hardness of 1500 HV to 2000 HV.

7. A bipolar plate according to claim 1, wherein the carbon-containing coating comprises in order:
    a) a titanium seed layer with a thickness of 0.5 μm or less;
    b) a titanium nitride interfacial layer with a thickness of 0.5 μm or less; and
    c) a a-C top layer with a thickness of 1.0 μm or less,
and wherein the bipolar plate is formed from stainless steel and has a thickness of 0.5 mm or less.

8. A bipolar plate according to claim 1, wherein the a-C layer has a molar hydrogen content of 5% or less, an sp$^2$ carbon content of 50% to 70%, and an sp$^3$ carbon content of 30% to 60%.

9. A bipolar plate for a hydrogen fuel cell, coated with a carbon-containing coating, the carbon-containing coating comprising in order:
    a) a seed layer comprising a metal or alloy;
    b) an interfacial layer comprising a carbide or nitride of the metal/alloy in the seed layer; and
    c) a top layer comprising a-C;
wherein the a-C has a density of greater than 3.0 g/cm$^3$, a molar hydrogen content of 5% or less, an sp$^2$ carbon content of 40% to 70%, and an sp$^3$ carbon content of 30% to 60%.

10. A bipolar plate according to claim 9, wherein the layer of a-C has a molar hydrogen content of 2% or less.

11. A bipolar plate according to claim 9, wherein the layer of a-C has an average sp$^2$ carbon content of about 55% and/or wherein the layer of a-C has an average sp$^3$ carbon content of about 45%.

12. A bipolar plate according to claim 9, wherein the bipolar plate is formed from stainless steel.

13. A bipolar plate according to claim 9, wherein the bipolar plate and seed layer are adjacent, the seed layer and interfacial layer are adjacent, and interfacial layer and top layer comprising a-C layer are adjacent.

14. A bipolar plate according to claim 9, wherein the carbon-containing coating comprises in order:
    a) a seed layer comprising a metal or alloy with a thickness of 0.5 μm or less;
    b) an interfacial layer comprising a carbide or nitride of the metal/alloy in the seed layer with a thickness of 0.5 μm or less; and
    c) a top layer comprising a-C with a thickness of 1.0 μm or less;
wherein the a-C has a density of greater than 2.0 g/cm$^3$, a molar hydrogen content of 5% or less, an sp$^2$ carbon content of 40% to 80%, and an sp$^3$ carbon content of 20% to 60%.

15. A hydrogen fuel cell comprising one or more bipolar plates according to claim 1.

16. A method of coating a bipolar plate for a PEM hydrogen fuel cell with a carbon-containing coating, the method comprising:
    a) applying onto the plate a seed layer comprising a metal;
    b) applying onto the seed layer an interfacial layer comprising a nitride or carbide of the metal; and
    c) applying onto the interfacial layer a layer comprising a-C,
wherein the a-C has a density of greater than 3.0 g/cm$^3$, a molar hydrogen content of 5% or less, an sp$^2$ carbon content of 40% to 80%, and an sp$^3$ carbon content of 20% to 60%.

17. A method of coating a bipolar plate for a PEM hydrogen fuel cell with a carbon-containing coating according to claim 16, wherein the method comprises:
    a) applying onto the plate a seed layer comprising a metal via a HIPIMS, DC pulse or metallic FCVA deposition process;
    b) applying onto the seed layer an interfacial layer comprising a nitride or carbide of the metal via a sputtering process; and
    c) applying onto the interfacial layer a layer comprising a-C via an FCVA process.

18. A method of coating a bipolar plate for a PEM hydrogen fuel cell according to claim 17, wherein the seed layer is titanium and the interfacial layer is titanium nitride.

* * * * *